US011114287B2

(12) United States Patent
Harris et al.

(10) Patent No.: US 11,114,287 B2
(45) Date of Patent: Sep. 7, 2021

(54) RADICAL OUTPUT MONITOR FOR A REMOTE PLASMA SOURCE AND METHOD OF USE

(71) Applicant: MKS Instruments, Inc., North Andover, MA (US)

(72) Inventors: Michael Harris, Hudson, MA (US); Chiu-Ying Tai, Chelmsford, MA (US); Atul Gupta, Lexington, MA (US)

(73) Assignee: MKS INSTRUMENTS, INC., Andover, MA (US)

( * ) Notice: Subject to any disclaimer, the term of this patent is extended or adjusted under 35 U.S.C. 154(b) by 173 days.

(21) Appl. No.: 16/438,827

(22) Filed: Jun. 12, 2019

(65) Prior Publication Data

US 2019/0385829 A1     Dec. 19, 2019

Related U.S. Application Data

(60) Provisional application No. 62/684,820, filed on Jun. 14, 2018.

(51) Int. Cl.
*H01J 37/32* (2006.01)
*H05H 1/24* (2006.01)

(52) U.S. Cl.
CPC .. *H01J 37/32935* (2013.01); *H01J 37/32449* (2013.01); *H05H 1/24* (2013.01)

(58) Field of Classification Search
CPC ............... H01J 37/321; H01J 37/32357; H01J 37/32467; H01J 37/32477; H01J 37/32495; H01J 37/3266; H01J 37/32935; H01J 37/32449; H05H 1/2406; H05H 1/46;

(Continued)

(56) References Cited

U.S. PATENT DOCUMENTS

| 5,349,154 A | 9/1994 | Harker et al. |
| 5,429,070 A | 7/1995 | Campbell et al. |
| 5,478,608 A | 12/1995 | Gorokhovsky |

(Continued)

FOREIGN PATENT DOCUMENTS

| EP | 0520519 A1 | 12/1992 |
| EP | 0376546 B1 | 10/1999 |

(Continued)

OTHER PUBLICATIONS

International Search Report dated Jul. 8, 2008 to the PCT Application No. PCT/US2007/081875, 2 pages.

(Continued)

*Primary Examiner* — Renan Luque

(57) ABSTRACT

The present application discloses a device for radical monitoring a plasma source for a remote plasma source used in a processing system and includes at least one gas source, a plasma source body having at least one passage having at least one passage surface, a first thermal sensor receiver may be formed within the plasma source body proximate to the passage surface of the passage, a first thermal sensor positioned within the first thermal sensor receiver configured to measure a first temperature of the passage surface, a second thermal sensor receiver formed within the plasma source body proximate to the passage surface of the passage and configured to measure a second temperature of the passage surface of the passage at a second location.

20 Claims, 9 Drawing Sheets

(58) Field of Classification Search
CPC ... H05H 2001/2462; H05H 2001/4667; H05H 2001/4682; H05H 1/24
See application file for complete search history.

(56) References Cited

U.S. PATENT DOCUMENTS

| | | | |
|---|---|---|---|
| 5,587,207 | A | 12/1996 | Gorokhovsky |
| 6,043,608 | A | 3/2000 | Samukawa et al. |
| 6,150,628 | A | 11/2000 | Smith et al. |
| 6,352,049 | B1 | 3/2002 | Yin et al. |
| 6,418,874 | B1 | 7/2002 | Cox et al. |
| 6,422,172 | B1 | 7/2002 | Tanaka et al. |
| 6,432,260 | B1 | 8/2002 | Mahoney et al. |
| 6,635,578 | B1 | 10/2003 | Xu et al. |
| 6,679,981 | B1 | 1/2004 | Pan et al. |
| 6,855,906 | B2 | 2/2005 | Brailove |
| 7,268,084 | B2 | 9/2007 | Chen et al. |
| 7,550,381 | B2 | 6/2009 | Lu et al. |
| 7,861,668 | B2 | 1/2011 | Toyoda et al. |
| 9,035,553 | B2 | 5/2015 | Choi |
| 9,275,839 | B2 | 3/2016 | Chen et al. |
| 2002/0008480 | A1 | 1/2002 | Yamazaki et al. |
| 2002/0046991 | A1 | 4/2002 | Smith et al. |
| 2003/0079686 | A1 | 5/2003 | Chen et al. |
| 2004/0206730 | A1 | 10/2004 | Holber et al. |
| 2005/0000655 | A1 | 1/2005 | Wi |
| 2005/0100669 | A1 | 5/2005 | Kools et al. |
| 2005/0276928 | A1 | 12/2005 | Okumura et al. |
| 2006/0118240 | A1 | 6/2006 | Holber et al. |
| 2006/0197037 | A1 | 9/2006 | Purser et al. |
| 2007/0003698 | A1 | 1/2007 | Chen et al. |
| 2007/0012563 | A1 | 1/2007 | Wi |
| 2007/0015360 | A1 | 1/2007 | Lu et al. |
| 2007/0079935 | A1 | 4/2007 | Schuss et al. |
| 2007/0119370 | A1 | 5/2007 | Ma et al. |
| 2007/0245962 | A1 | 10/2007 | Choi |
| 2007/0245963 | A1 | 10/2007 | Choi |
| 2007/0274893 | A1 | 11/2007 | Wright et al. |
| 2010/0055347 | A1* | 3/2010 | Kato ............... C23C 16/45551 427/569 |
| 2013/0118589 | A1 | 5/2013 | Hu et al. |
| 2015/0279631 | A1 | 10/2015 | Hoffman et al. |
| 2015/0318148 | A1* | 11/2015 | Chen ............... H01J 37/32229 315/39 |
| 2016/0077508 | A1 | 3/2016 | Schauer |
| 2016/0307739 | A1 | 10/2016 | Lee et al. |
| 2019/0006154 | A1 | 1/2019 | Hu |
| 2019/0048770 | A1* | 2/2019 | Wang ............... F02M 26/36 |

FOREIGN PATENT DOCUMENTS

| | | |
|---|---|---|
| EP | 0884760 B1 | 3/2003 |
| EP | 2296166 B1 | 1/2014 |
| EP | 2394496 B1 | 4/2014 |
| JP | 7-254496 A | 10/1995 |
| JP | 9-55372 A | 2/1997 |
| JP | 3381916 B2 | 3/2003 |
| JP | 2004047192 A | 2/2004 |
| JP | 2011086564 A | 4/2011 |
| JP | 4861329 B2 | 1/2012 |
| JP | 2012094399 A | 5/2012 |
| KR | 100231221 B1 | 11/1999 |
| KR | 10-2004-0079559 A | 9/2004 |
| KR | 101488538 B1 | 2/2015 |
| KR | 1020160129304 A | 11/2016 |
| RU | 2209532 C2 | 7/2003 |
| WO | WO2006/037991 A2 | 4/2006 |
| WO | WO2011/024174 A9 | 3/2011 |
| WO | WO2014007472 A1 | 1/2014 |
| WO | WO2004/023853 A1 | 3/2014 |
| WO | WO2016/141464 A1 | 9/2016 |

OTHER PUBLICATIONS

The International Search Report dated Sep. 30, 2019 to the PCT Application No. PCT/US2019/036796, 2 pages.
The written opinion dated Sep. 30, 2019 to the PCT Application No. PCT/US2019/036796, 2 pages.

* cited by examiner

RADICAL OUTPUT MONITOR FOR A REMOTE PLASMA SOURCE AND METHOD OF USE

CROSS-REFERENCE TO RELATED APPLICATIONS

The present application claims priority to U.S. Prov. Pat. Appl. Ser. No. 62/684,820, entitled "Radical Output Monitor for a Remote Plasma Source and Method of Use," filed on Jun. 14, 2018, the contents of which are incorporated by reference in their entirety herein.

BACKGROUND

Plasma sources are used in a variety of applications. For example, the radical output from a plasma sources is frequently employed in semiconductor processing applications. Most applications requiring the use of plasma sources require precise measurement and monitoring of radicals within generated plasma. Unfortunately, accurate measurement and monitoring of the radical output has proven difficult and problematic due to a number of factors. For example, radicals within the plasma have extremely short lifetimes due to their highly reactive and recombinative nature.

Presently, various methods form measuring and monitoring the radical output from plasma sources are used with varying degrees of success. Exemplary measuring and monitoring processes include calorimetry-based processes, titration-based processes, and the like. While calorimetry-based processes and titration-based processes have proven somewhat useful in the past, a number of shortcomings have been identified. For example, both calorimetry-based processes and titration-based processes require either a sampling based methodology and/or up batch/pre-measurement methodology configured to measure the total radical output before and/or after one or more substrates are processed. Furthermore, both calorimetry-based processes and titration-based processes inevitably result in the destruction of the radicals being measured. While alternative nondestructive methodologies for measuring and/or monitoring radical output from a plasma source exist precise measurement and monitoring of radicals within a plasma has proven difficult.

In light of the foregoing, there is an ongoing need for system and method of monitoring the radical output from a plasma source.

SUMMARY

The present application discloses various embodiments of plasma sources capable of having the radical output of the plasma source monitored during use. In some embodiments, the plasma source comprises a remote plasma source used in semiconductor manufacturing and processing applications. In another embodiment, the plasma source may comprise any variety of plasma sources used in any variety of applications.

In one embodiment, the present application is directed to a plasma source for a semiconductor processing system and includes at least one gas source configured to provide at least one gas. The gas source may be coupled to or otherwise in fluid communication with a plasma source body. The plasma source body includes at least one gas inlet in fluid communication with the gas source and at least one gas outlet. Further, the plasma source includes at least one passage having at least one passage surface formed within the plasma source body. The passage is in fluid communication with the gas inlet and gas outlet and is configured to have at least one plasma region formed therein. A first thermal sensor receiver may be formed within the plasma source body proximate to the passage surface of the passage. A first thermal sensor may be positioned within the first thermal sensor receiver and configured to measure a first temperature of the passage surface of the passage at a first location. A second thermal sensor receiver may be formed within the plasma source body proximate to the passage surface of the passage. In one embodiment, the second thermal sensor receiver may be formed within the plasma source body proximate to the gas outlet. A second thermal sensor may be positioned within the second thermal sensor receiver and configured to measure a second temperature of the passage surface of the passage at a second location.

In another embodiment, the present application is directed to a plasma source for a processing system. More specifically, the plasma source includes at least one gas source configured to provide at least one gas. A plasma source body defining at least one gas inlet and at least one gas outlet is in fluid communication with the gas source. The plasma source may include at least one passage having at least one passage surface formed within the plasma source body, wherein the passage is in fluid communication with the gas inlet and the gas outlet. At least one power source is positioned on or proximate to the plasma source body and is in communication with at least one power supply. During use, the power source may be configured to generate at least one plasma region within the plasma source body. The plasma region may be configured to disassociate the gas flowing within the passage thereby forming at least one disassociated gas which may be evacuated from plasma source body via the outlet. A first thermal sensor receiver may be formed within the plasma source body proximate to the passage surface of the passage and a first thermal sensor may be positioned within the first thermal sensor receiver. The first thermal sensor is configured to measure a first temperature of the passage surface of the passage at a first location. Further, a second thermal sensor receiver may be formed within the plasma source body proximate to the passage surface of the passage. Optionally, the second thermal sensor receiver may be formed within the plasma source body proximate to the gas outlet. A second thermal sensor may be positioned within the second thermal sensor receiver and configured to measure a second temperature of the passage surface of the passage at a second location. Lastly, at least one thermal regulating device may be coupled to the plasma source body.

In another embodiment, the present application discloses a method of monitoring the radical output from a plasma source, which includes providing a plasma source body defining at least one gas inlet in fluid communication with at least one gas source and at least one gas outlet. The plasma source includes at least one passage defined by at least one passage surface formed within the plasma source body wherein the passage is in fluid communication with the gas inlet and the gas outlet. At least one input gas is flowed from the gas source into the passage via the inlet. At least one plasma region may be formed within the plasma source body with at least one power source. At least a portion of the input gas flowing thought the passage may be disassociated to form at least one disassociated gas. A first temperature resulting from recombination of the disassociated gas may be measured with at least a first sensor positioned proximate to the plasma region. Further, at least a second temperature of at least one re-disassociated gas may be measured with at least a second sensor positioned distally from the plasma region. Lastly, the radical output of the plasma source may be monitored by comparing the first temperature of the recombination of the disassociated gas measure by the first sensor to the second temperature of the re-disassociated gas measured with the second sensor.

Other features and advantages of the radical output monitor for remote plasma sources as described herein will become more apparent from a consideration of the following detailed description.

BRIEF DESCRIPTION OF THE DRAWINGS

The novel aspects of the radical output monitor for remote plasma sources as disclosed herein will be more apparent by review of the following figures, wherein.

DETAILED DESCRIPTION

Figure 1:
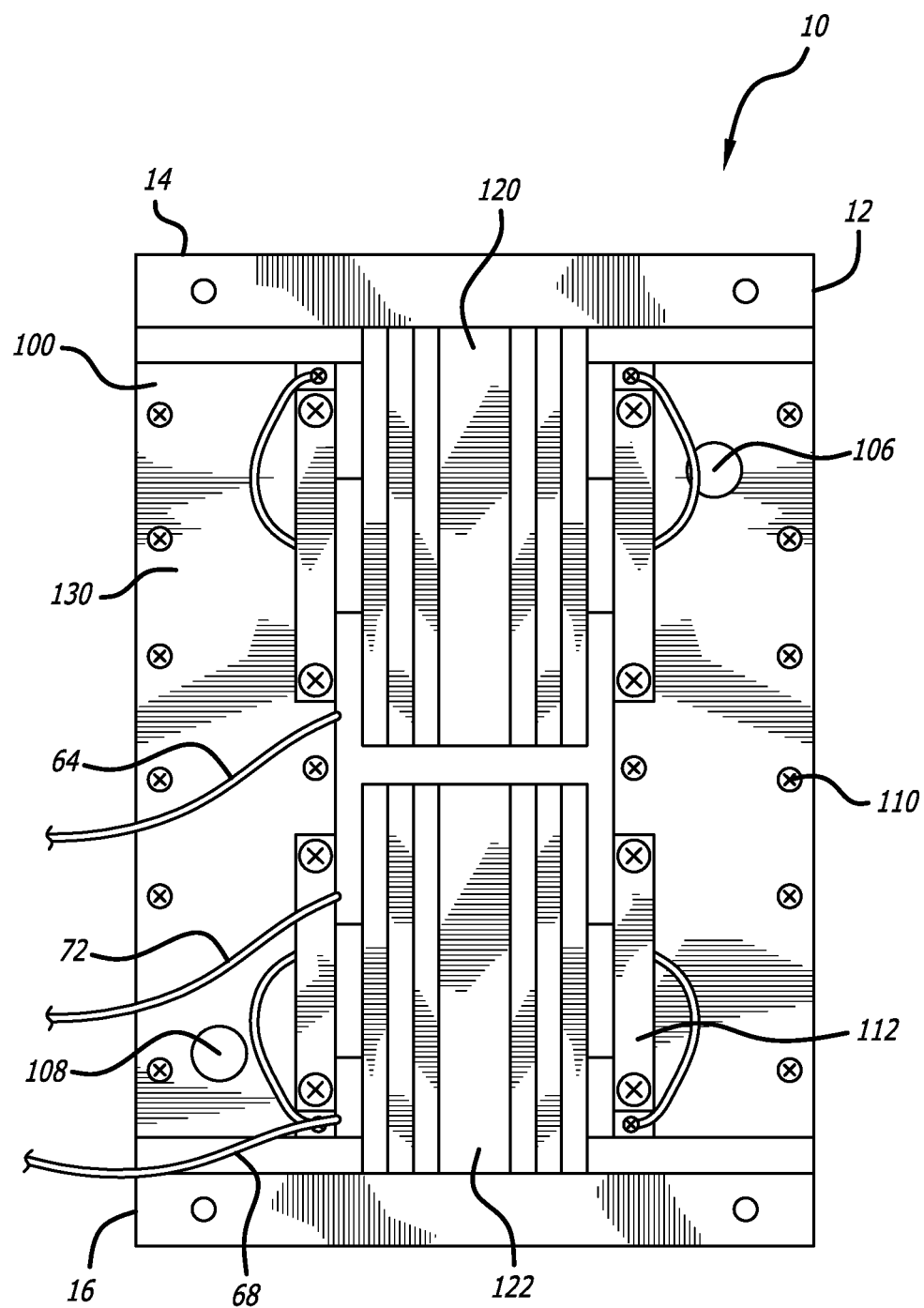
FIG. 1 shows a planar perspective view of an embodiment of a plasma source.

The present application discloses various embodiments of plasma sources capable of having the radical output of the plasma source monitored during use. In some embodiments, the plasma source comprises a remote plasma source used in semiconductor manufacturing and processing applications. In other embodiments, the plasma source may comprise any variety of plasma sources used in any variety of applications. As shown in FIGS. 1-4, the plasma source 10 may include at least one plasma source body 12. In the illustrated embodiment, the plasma source body 12 includes a first plate or body member 14 and at least a second plate or body member 16. One or more support members or plasma chamber sections may be positioned between the first body member 14 and the second body member 16. For example, as shown in FIGS. 2 and 3, a first support member 18 and at least a second support member 20 are positioned between the first body member 14 and the second body member 16 of the plasma source body 12. Optionally, those skilled in the art will appreciate that any number of support members may be positioned between the first body member 14 and second body member 16.

Figure 2:
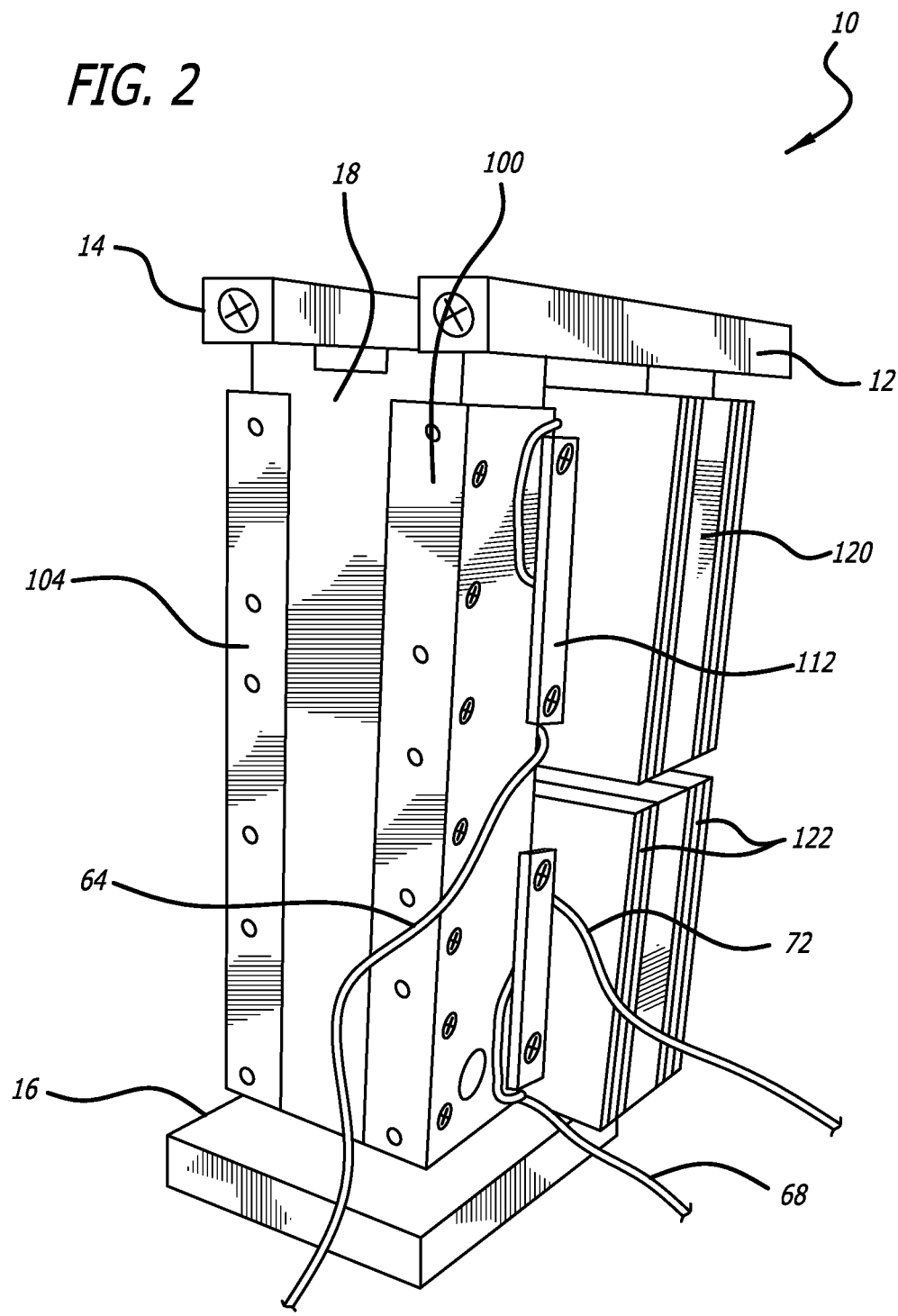
FIG. 2 shows an elevated side perspective view of an embodiment of a plasma source.
Figure 3:
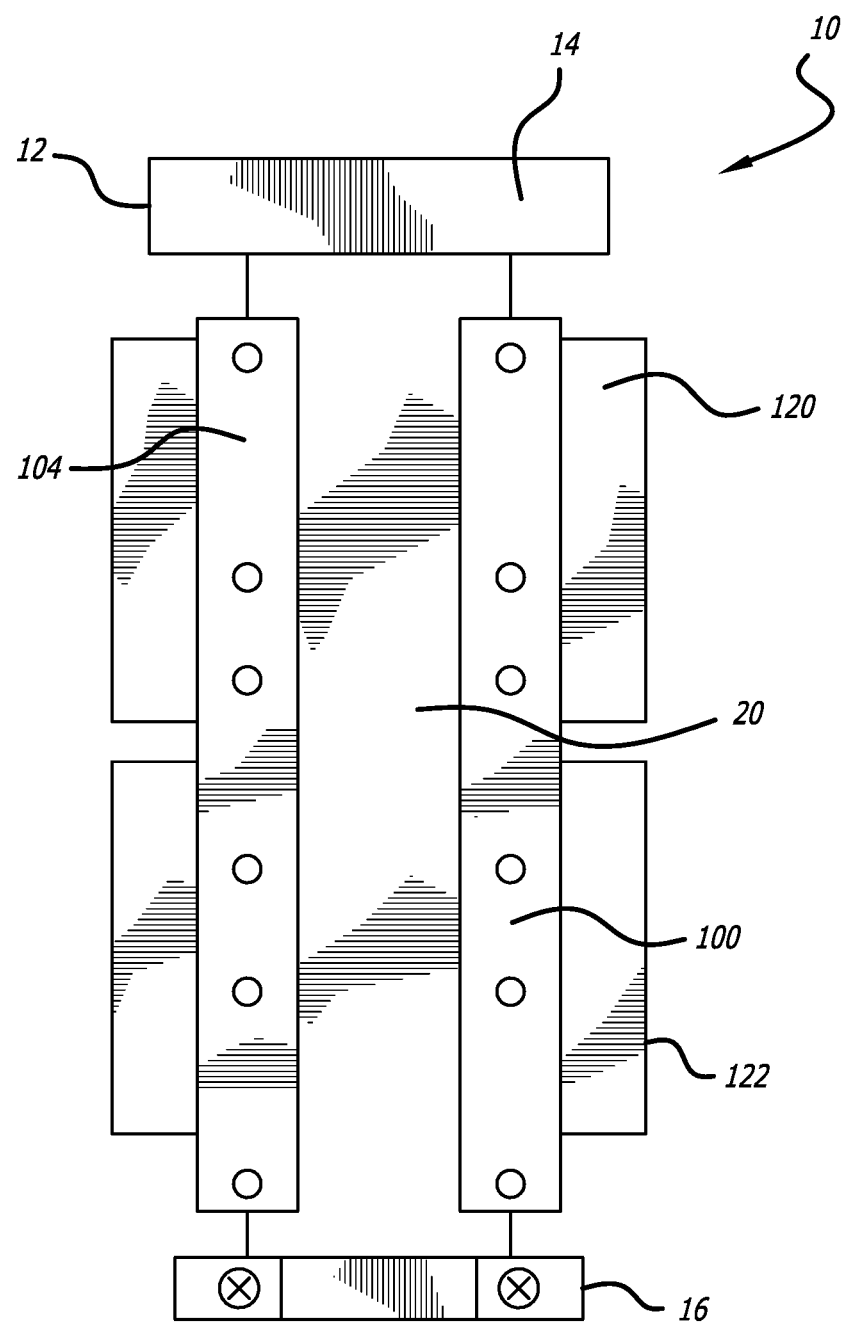
FIG. 3 shows a planar side perspective view of an embodiment of a plasma source.
Figure 9:
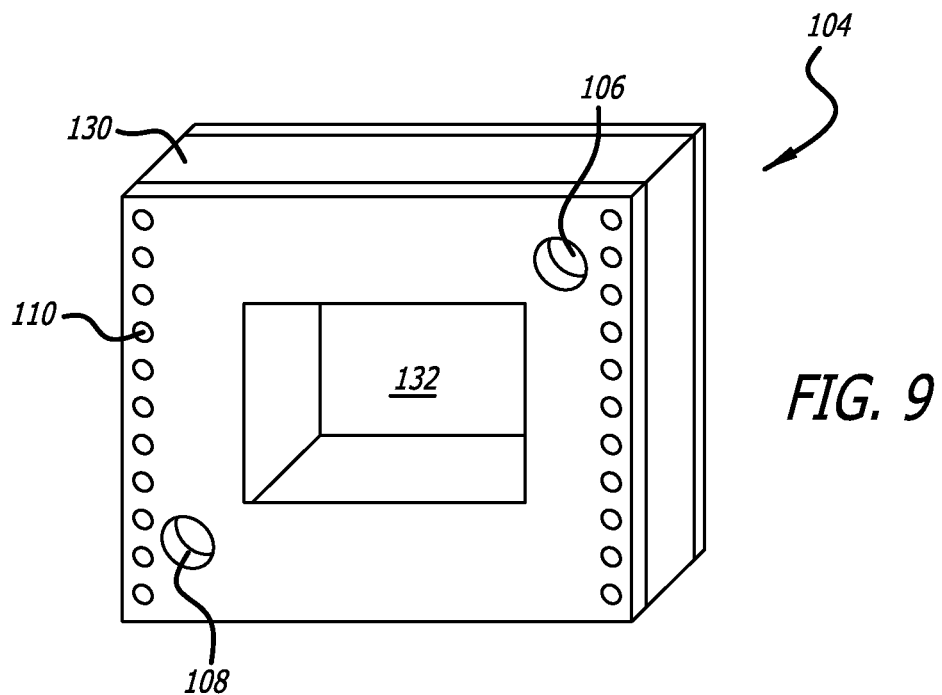
FIG. 9 shows an elevated perspective view on an embodiment of a thermal regulating device used within an embodiment of a plasma source.

As shown in FIGS. 1-4 and 9, at least one thermal regulating device may be affixed to or otherwise coupled to the plasma source body 12. In one embodiment, at least one thermal regulating device may be configured to actively regulate the temperature of at least a portion of the plasma source body 12 or the various components thereof. In the illustrated embodiments, a first thermal regulating device 100 and at least a second thermal regulation device 104 are detachably coupled to the plasma source body 12. Optionally, any number of thermal regulating devices may be used with the plasma source 10. As shown in FIGS. 1 and 9 at least one of the thermal regulating devices, 100, 104 may include at least one regulating device body 130. In the illustrated embodiments, the regulating device body 130 may include one or more apertures, ports, or openings formed thereon. More specifically, in the illustrated embodiments the regulating body 130 of the first thermal regulating device 100 and second thermal regulating device 104 includes at least one inlet 106 and at least one outlet 108 formed thereon, although those skilled in the art will appreciate the any number of inlets and/or outlets may be formed on the regulating device body 130. In one embodiment, the inlet 106 and outlet 108 are configured to permit one or more fluids or materials to be introduced into and/or removed from the regulating device body 130 during use. For example, FIG. 9 shows an elevated perspective view of an embodiment of the second thermal regulating device 104 wherein the inlet 106 and outlet 108 are in fluid communication with a regulating device body 130 forming the second thermal regulating device 104. As such, one or more fluids or materials may be introduced into and evacuated from the regulating device body 130 via at least one of the inlet 106 and/or outlet 108. In the embodiment shown in FIG. 9 the regulating device body 130 includes at least one aperture or passage 132 formed therein. Optionally, those skilled in the art will appreciate that the regulating device body 130 need not include the aperture or passage 132. In one embodiment, at least one of the first thermal regulating device 100 and the second thermal regulating device 104 may be manufactured from at least one material having a high coefficient of thermal conductivity. For example, at least one of the first thermal regulating device 100 and a second thermal regulating device 104 may be manufactured from copper, aluminum, various alloys, and the like. Further, at least one of the first thermal regulating device 100 and the second thermal regulating device 104 may include one or more features formed on the regulating device body 130 configured to enhance or increase the surface area of the thermal regulating device 100, 104 thereby enhancing thermal performance. In another embodiment, the thermal regulating devices 100, 104 comprise cold plates, chillers, fluid-based cooling devices or similar devices positioned proximate to and in thermal contact with at least a portion of the plasma source body 12.

In addition, one or more fastener or coupling apertures 110 may be formed on at least one of the first thermal regulating device 100, the second thermal regulating device 104, or both. In one embodiment, the coupling apertures 110 may be configured to permit at least one of the first thermal regulating device 100, the second thermal regulating device 104, or both to be coupled to or otherwise affixed to the plasma source body 12. As such, the coupling apertures 110 may be sized and configured to receive one or more fasteners therein. In another embodiment, at least one thermal regulating device 100, 104 may be coupled to the plasma source body 12 using any variety of devices and methods known in the art, including, without limitations, bolts, screws, friction fit devices, retention devices, welds, and the like.

As shown in FIGS. 1-4, one or more electrical devices may be coupled to at least one of the thermal regulating devices 100, 104, and/or components forming or coupled to the plasma source body 12. In the illustrated embodiment, a first power source 120 and at least a second power source 122 are coupled to or otherwise affixed to the plasma source body 12 proximate to the thermal regulating devices 100, 104. Exemplary alternate electrical devices or power sources include, without limitations, RF sources, plasma generators, transformers, capacitors, electromagnets, inductors, sensors, field generation devices, and the like. Optionally, as shown in FIGS. 1 and 2, one or more coupling devices or fixtures 112 may be used to electrically couple and/or ground at least one of the first power source 120, second power source, 122 or both to the plasma source body 12.

Referring again to FIGS. 1 and 2, the plasma source 10 may include one or more thermal sensors 62, 66, 70 (See FIGS. 6-8) positioned on or at various locations on the plasma source body 12. The various thermal sensors may be in communication with one or more processors or controllers (See FIG. 10, processing control system 170) via one or more sensor conduits (See FIG. 10, conduit 64, 68, 72). In the illustrated embodiment a first sensor conduit 64, a second sensor conduit 68, and a third sensor conduit 72 are shown coupled to the plasma support body 12. Those skilled in your will appreciate that the plasma source 10 may include a first sensor 62 and at least a second sensor 66. A more detailed description of the first sensor 62, second sensor 66, and additional optional sensors 70 will be provided in subsequent paragraphs.

Figure 4:
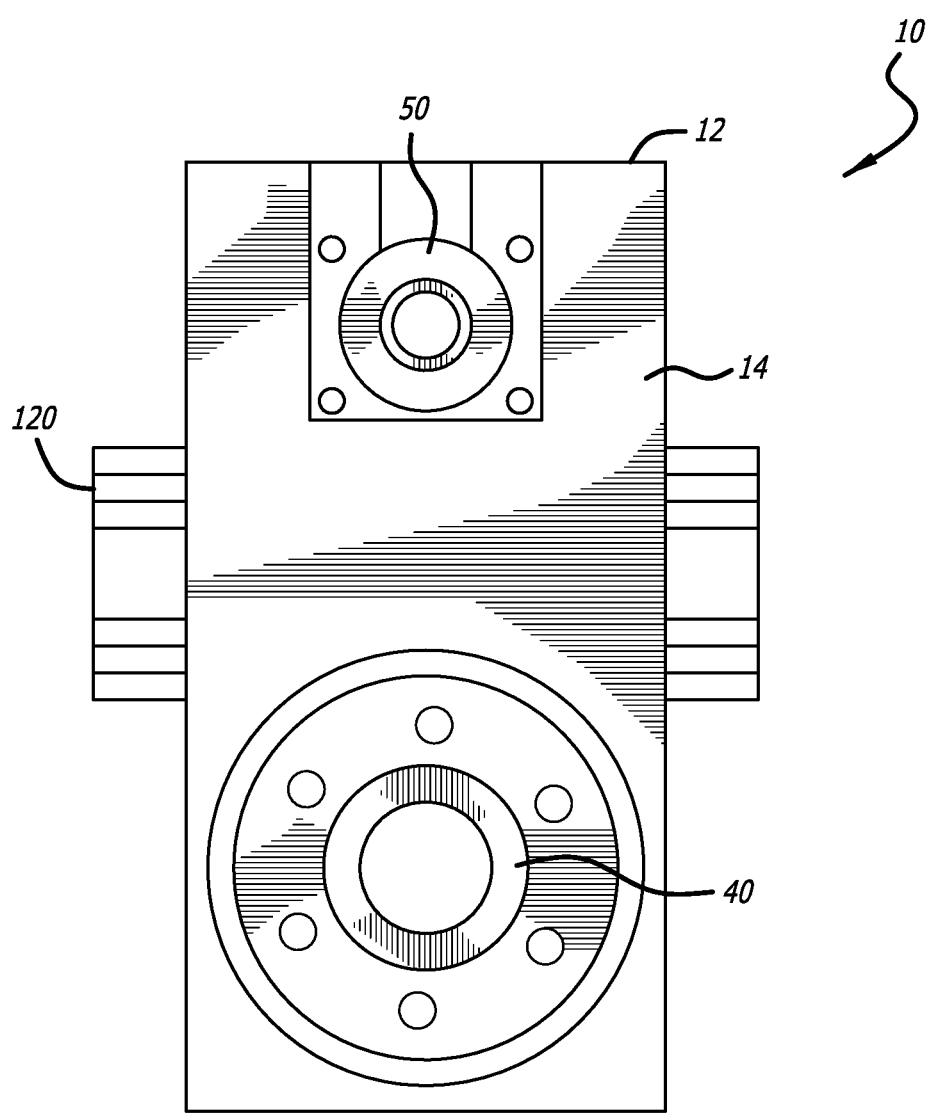
FIG. 4 shows a planar top perspective view of an embodiment of a plasma source.
Figure 5:
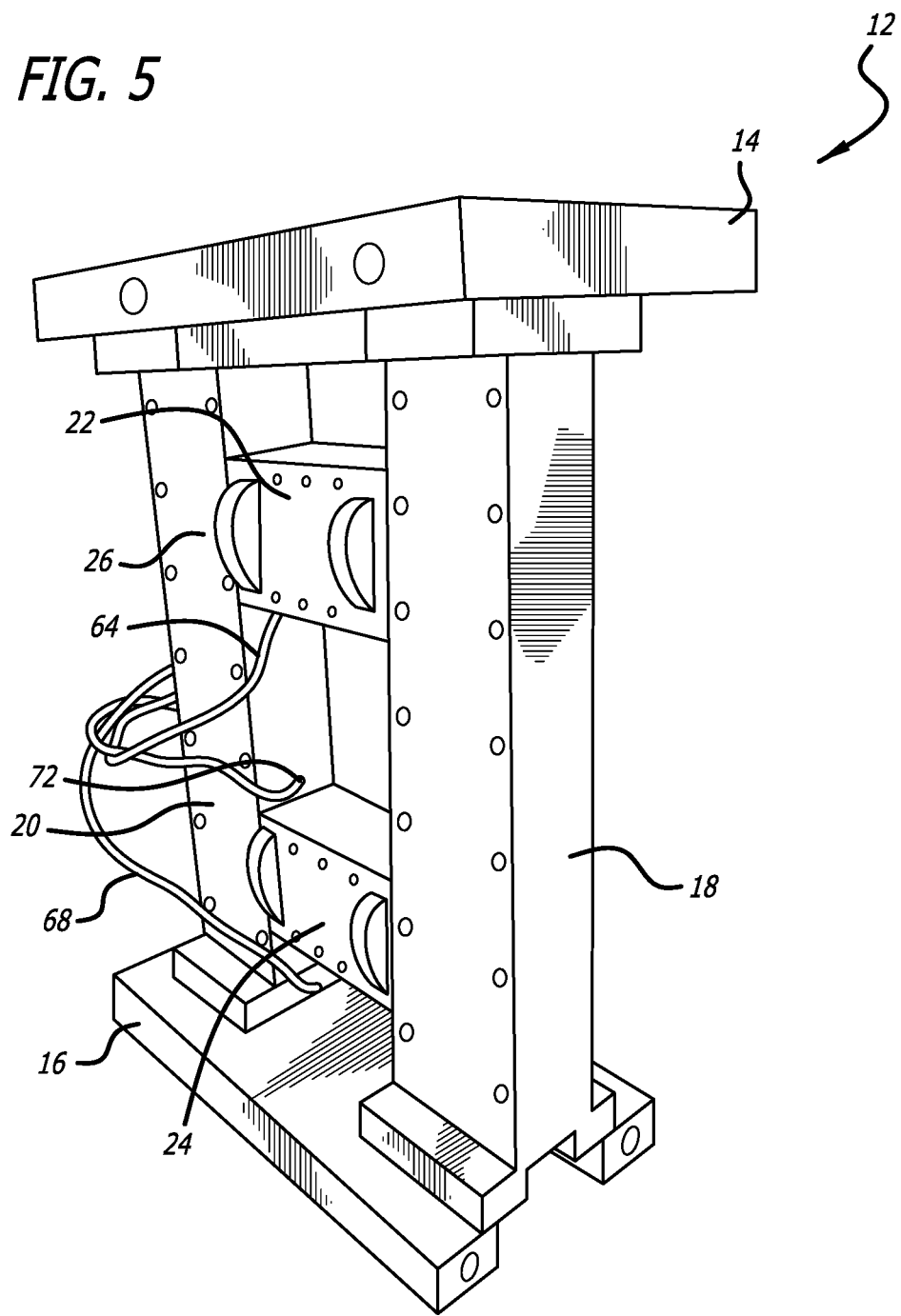
FIG. 5 shows an elevated side perspective view of an embodiment of a plasma source.

FIGS. 2-6 show various features and elements of the plasma source body 12. As shown in FIGS. 2, 3, and 5, the plasma source body 12 may include one or more support members or plasma chamber sections 18, 20 positioned between the first body member 14 and the second body member 16. In the illustrated embodiment, a first support member 18 and a second support member 20 are positioned between and in fluid communication with the first body member 14 and second body member 16, although those skilled in the art will appreciate the any number of support members may be used to form a portion of the plasma source body 12. Further, at least one plasma chamber, region, and/or body block may be positioned between any communication with at least one of the first body member 14, second body member 16, first support member 18, and second support member 20. In the illustrated embodiment, a first plasma chamber 22 is coupled to and in fluid communication with the first support member 18 and the second support member 20. Similarly, the second plasma chamber 24 is coupled to and in fluid communication with the first support member 18 and the second support member 20. In the illustrated embodiment the first plasma chamber 22 and second plasma chamber 24 are orthogonal to the first support member 18 and the second support member 20, although those skilled in the art will appreciate that at least one of the first plasma chamber 22 and second plasma chamber 24 need not be orthogonal to at least one of the first support member 18 and/or the second support member 20. In the illustrated embodiment, the plasma source 10 comprises a toroidal remote plasma source although those skilled in the art will appreciate that the plasma source body 12 may be formed in any variety of shapes and configurations.

Optionally, the various components forming the plasma source body 12 including the first body member 14, second body member 16, first support member 18, second support member 20, first plasma chamber 22, and the second plasma chamber 24 may be manufactured from any variety of materials including, without limitation, aluminum, stainless steel, copper, various alloys, and the like. Further, at least one isolator, gasket, or similar device may be positioned between the plasma chambers 22, 24 and at least one of the first support member 18 and/or the second support member 20. For example, in the illustrated embodiment an isolator 26 is positioned between the first support member 18 and the first plasma chamber 22. In addition, an additional isolator 26 is positioned between the first plasma chamber 22 and the second support member 20. Likewise, as shown in FIGS. 5 and 6 an isolator 26 may be positioned between the second plasma chamber 24 and the first support member 18 and/or the second support member 20.

Figure 6:
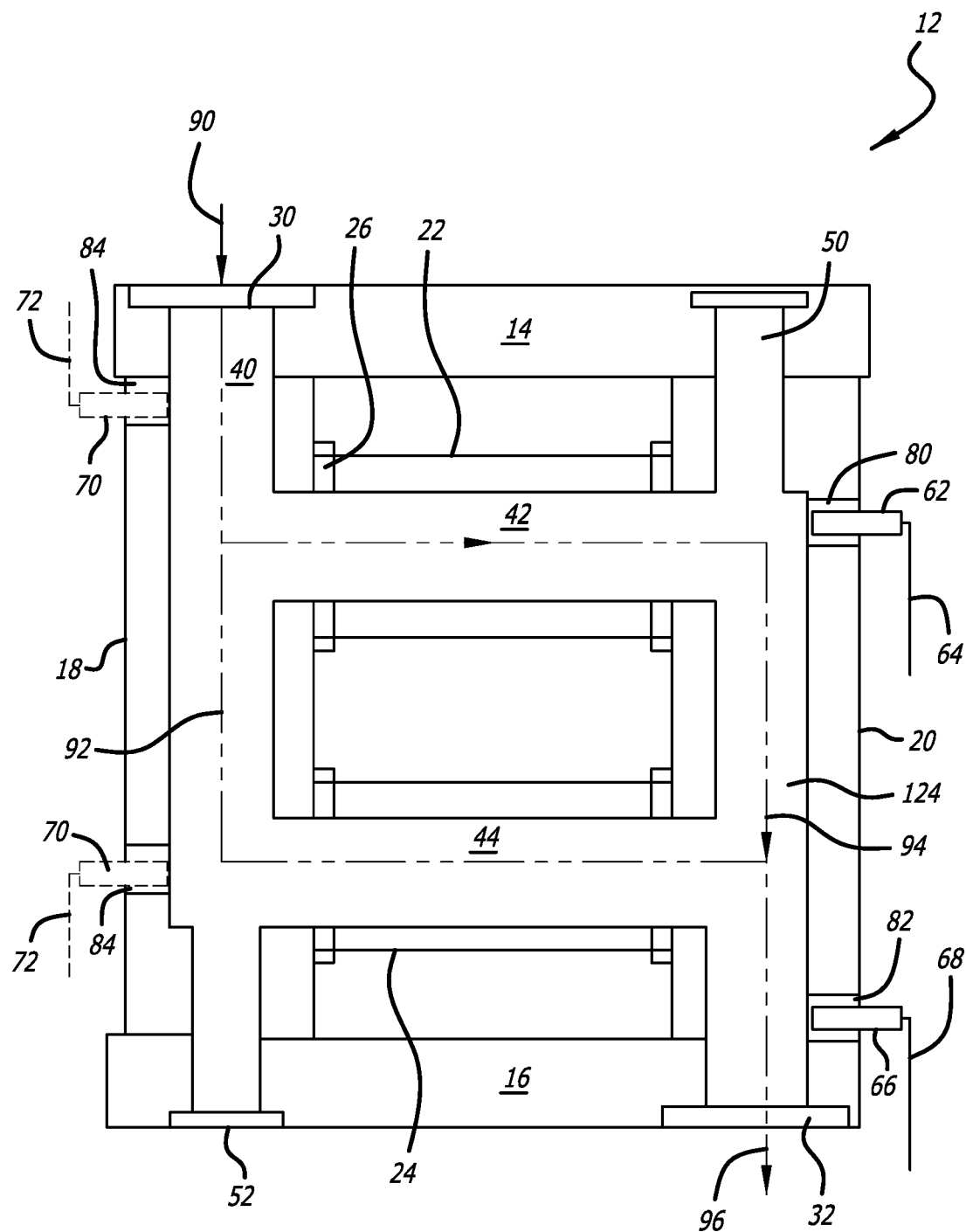
FIG. 6 shows cross-sectional view of an embodiment of a plasma source.

Referring to FIGS. 4-8, at least one passage 40 may be formed within the plasma source body 12. In one embodiment, the passage 40 may be formed from at least one passage or interface surface 86. Optionally, the passage surface 86 may include one or more features or materials applied thereto. For example, the passage surface 86 forming the passage 40 may include one or more surface treatments or modifications (e.g. anodizing, coatings, microstructuring, etc.) applied thereto. As shown in FIGS. 4 and 6, the passage 40 may be in communication with one or more inlets, outlets, or similar apertures formed in the various components forming the plasma source body 12. For example, in the illustrated embodiment the passage 40 is in fluid communication with at least one inlet 30 formed on the first body member 14 and at least one outlet 32 formed on the second body member 16. As such, one or more fluids, gases, or similar materials may be introduced into and evacuated from the passage 40 formed in the plasma source body 12. Optionally, one or more additional access ports may be formed in the plasma source body 12 in may or may not be in communication with a portion of the passage 40 formed therein. In the illustrated embodiment, at least one access port 50 may be formed in the first body member 14 and may be in communication with the passage 40. Similarly, a second access port 52 may be formed in the second body member 16 and may be in communication with the passage 40. In one embodiment, the access ports 50, 52 may be sized to receive one or more igniters, sensors, meters, or similar devices therein.

Figure 7:
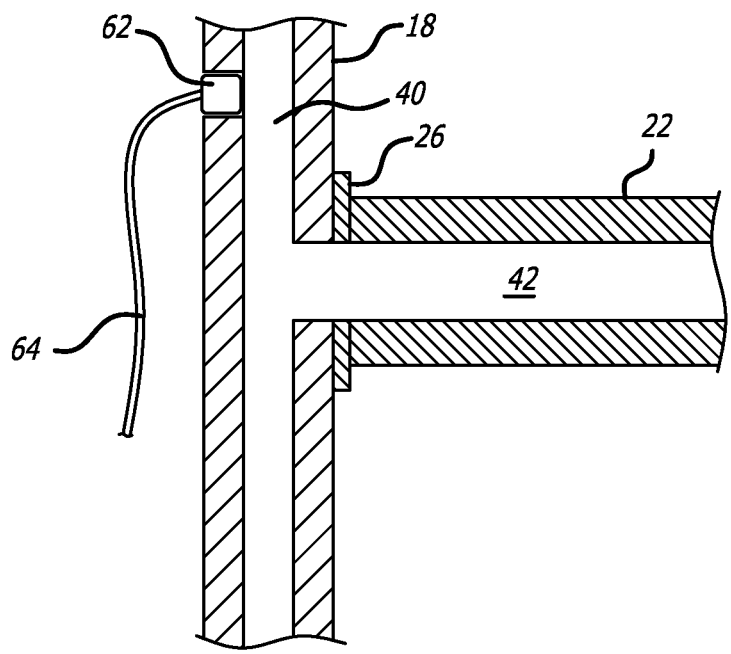
FIG. 7 shows a cross-sectional view of a portion of a passage formed within an embodiment of a plasma source.
Figure 8:
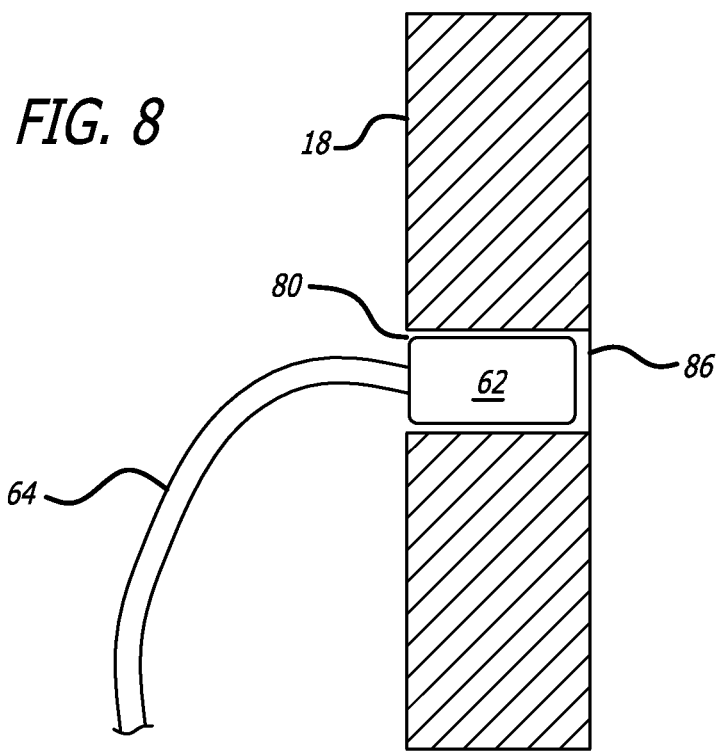
FIG. 8 shows a cross-section view of a sensor positioned within a sensor receiver proximate to passage wall of a passage formed within an embodiment of a plasma source.

As shown in FIGS. 6-8, the passage 40 formed in the plasma source body 12 may form multiple pathways. For example, as shown in FIG. 6 the passage 40 includes a first pathway 42 and at least a second pathway 44 formed within the plasma source body 12, although those skilled in the art will appreciate that any number of pathways may be formed within the plasma source body 12. Further, in the illustrated embodiments, the first pathway 42 is formed within the first plasma chamber 22 while the second pathway 44 may be formed within the second plasma chamber 24.

Referring again to FIGS. 6-8, one or more sensors may be positioned on or within the plasma source body 12 of the plasma source 10. In the illustrated embodiment, a first sensor 62 may be positioned within a first sensor receiver 80 formed in the plasma source body 12. More specifically, in the illustrated embodiment, the first sensor 62 is positioned within the first sensor receiver 80 such that the first sensor 62 is in close proximity to at least one passage surface 86 formed within or proximate to the passage 40 formed within the plasma source body 12. Optionally, the passage surface 86 may comprise at least one optical window, sensor window, where the like. Further, at least a second sensor 66 may be positioned within at least a second sensor receiver 82 formed within the plasma source body 12. In the illustrated embodiment, the second sensor receiver 82 may be positioned proximate to the outlet 32 of the plasma source body 12. In another embodiment, the second sensor receiver 82 need not be positioned proximate to the outlet 32. Like the first sensor, the second sensor 66 may be positioned in close proximity to at least one passage surface 86 formed within or proximate to the passage 40 formed within the plasma source body 12. Optionally, at least one optional sensor 70 may be positioned within at least an optional sensor receiver 84 formed within the plasma source body 12.

In one embodiment, at least one of the first sensor 62, second sensor 66, and optional sensor 70 comprises a thermal sensor configured to measure the temperature of the passage surface 86 of the passage 40, the first pathway 42, and second pathway 44, and the outlet 32 at one or more locations within the plasma source body 12, although those skilled in the art will appreciate that any variety of sensors may be used. Exemplary alternate sensors include, without limitations, optical sensors, flow sensors, and the like. Optionally, any variety of thermal sensors may be used with the plasma source 10, including, without limitations, thermocouples, thermopiles, thermisters, resistance thermometers, silicon bandgap temperature sensors, and the like. For example, in the illustrated embodiment, the first sensor 62 is located distally from the second sensor 66. For example, in the illustrated embodiment, the first sensor 62 is located proximate to the first plasma chamber 22 and may in communication with the passage 40 formed in the plasma source body 12 thereby permitting the first sensor 62 to measure a first temperature ($T_1$) of the passage surface 86 of the passage 40 formed in the plasma source body 12 at a first location, for example, proximate to the plasma region 124. In addition, the second sensor 66 is located proximate to the outlet 32 and may be configured to measure a second temperature ($T_2$) of the passage surface 86 of the passage 40 formed in the plasma source body 12 at a second location. As shown, in the illustrated embodiments, the second temperature ($T_2$) of the passage surface 86 of the passage 40 is measured proximate to the outlet 32. Optionally, any number of temperatures ($T_n$) of the passage surface 86 may be measured at any variety of locations within the passage 40 using any number of optional sensors 70 positioned on the plasma source body 12. As such, the user may calculate at least one temperature gradient between $T_1$, $T_2$, and/or $T_n$ (if present).

The present application further discloses a method of detecting variations in the output of radicals generated by at least one plasma source. For example, in one embodiment the plasma source 10 disclosed in FIGS. 1-9 may be used to detect variations in the radical output from a remote plasma source. Further, the plasma source 10 disclosed in the present application may be configured to provide a diagnostic method of monitoring changing gas and surface conditions within the passage 40 formed within the plasma source body 12. As shown in FIGS. 6-10, during use at least one processing gas 90 may be directed from at least one gas inlet 30 into the passage 40 formed within the plasma source body 12 to form at least one input gas 92. In one embodiment the processing gas 90 comprises hydrogen (H2), although any variety of alternate gases may be used but the present system. Exemplary alternate gases include, without limitations, fluorine-based gases (e.g. $NF_3$), oxygen ($O_2$), nitrogen ($N_2$), and the like. The processing gas 90/input gas 92 may be directed into and evacuated from the plasma source body 12 by one or more pumps (not shown) and directed to flow through the first pathway 42 and second pathway 44 formed in the passage 40. At least one power supply (not shown) may be coupled to the plasma source 10 to create at least one plasma in at least one plasma chamber 22, 24. The input gas 92 flowing through the first plasma chamber 22 and second plasma chamber 24 interacts with the plasma thereby energizing the input gas 92 to form at least one plasma region 124 within the passage 40. At least a portion of the input gas 92 flowing through the plasma region 124 is subjected to the plasma formed within the plasma region 124 and produces at least one reactive or disassociated gas 94 within at least a portion of the passage 40. Thereafter, the input gas 92/disassociated gas 94 may be evacuated from the plasma source 10 via the outlet 32. More specifically, as the input gas 92 is activated by the plasma along the passage 40 in the plasma source 10, a portion of the input gas 92 is disassociated in the plasma region 124 to form the disassociated gas 94. A portion of the disassociated gas 94 may recombine along the passage surface 86 of the passage 40 proximate to the first sensor 62.

Figure 10:
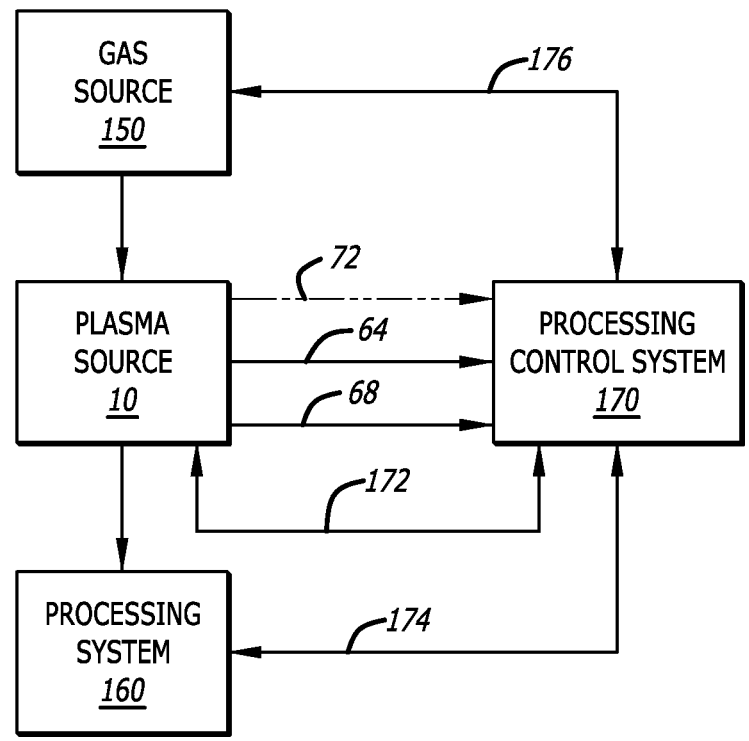
FIG. 10 shows a schematic diagram of an embodiment of a plasma source having a processing control system configured to selectively control the output of the gas source, the plasma source, and/or the processing system.

Referring again to FIGS. 1-9, during use the first sensor 62 which, in the illustrated embodiments, is positioned proximate to at least one of the first plasma chamber 22 in the second plasma chamber 24 may be configured to measure a first temperature ($T_1$) of the passage surface 86 within the passage 40 of the plasma source body 12 distally from the outlet 32. For example, in the illustrated embodiment, the first sensor 62 is configured to measure the temperature of the passage surface 86 at a location within or proximate to the plasma region 124. In one embodiment, the first temperature $T_1$ may reflect a temperature associate with recombination of the disassociated gas 94 at or proximate to the passage surface 86 of the passage 40 proximate to the first sensor 62. Further, the second sensor 66 positioned proximate to the outlet 32 of the passage 40 may be configured to measure at least a second temperature ($T_2$) of the passage surface 86 at a different location than the first sensor 62. For example, in the illustrated embodiment, the second sensor 66 is configured to measure the temperature of the passage surface 86 proximate to the output 96. In the illustrated embodiment, the second sensor 66 is positioned outside of the plasma region 124. As a result, a portion of the disassociated gas 94 may re-disassociate within the plasma region 124, thereby resulting a temperature variation ($T_2$) measured at the passage surface 86 by the second sensor 66 located proximate to the outlet 32. As such, the radical output of the plasma source 10 may be quickly (virtually immediately) and easily monitored by comparing the temperature differences between the first temperature $T_1$ measured by the first sensor 62 and the second temperature $T_2$ measured by the second sensor 66. Optionally, at least one optional sensor 70 may be positioned anywhere within the proximate to the passage 40 and may be configured to measure any number of additional temperatures ($T_n$) of the passage surface 86 at any desired location within the passage 40. Thereafter, as shown in FIGS. 6 and 10, the temperature data measured by the first sensor 62, second sensor 66, and optional sensor 70 may be provided to at least one processing control system 170 via the first sensor conduit 64, the second sensor conduit 68, and the optional sensor conduit 72. In one embodiment, the processing control system 170 may be configured to receive data from at least one of the gas source 150, the plasma source 10, and/or the processing system 160. Further, the processing control system 170 may be configured to provide data and or control commands 172, 174, 176 to at least one of the gas source 150, plasma source 10, and/or the processing system 160 thereby permitting the processing control system 170 actively control at least one of the gas source 150, the plasma source 10, and/or the processing system 160. In one embodiment, the processing control system 170 may be configured to correlate and approximate the temperature of the passage surface 86 to the temperature of the reactive gas 94 flowing within the passage 40 at various locations. Further, the processing control system 170 may be configured to estimate the radical output generated by permitting the user to more accurately determine radical losses and/or radical recombination effects within or proximate to the first plasma chamber 22, the second plasma chamber 24, and/or various other locations with in plasma source body 12 by comparing the temperatures $T_1$ and $T_n$ to the temperature $T_2$ measured by the second sensor 66 positioned proximate to the outlet 32. As such, the processing control system 170 may be configured to permit the user to actively monitor and control the gas source 150, plasma source 10, and/or the processing system 160 to maintain a consistent reactive gas flow to the processing system 160.

Figure 11:
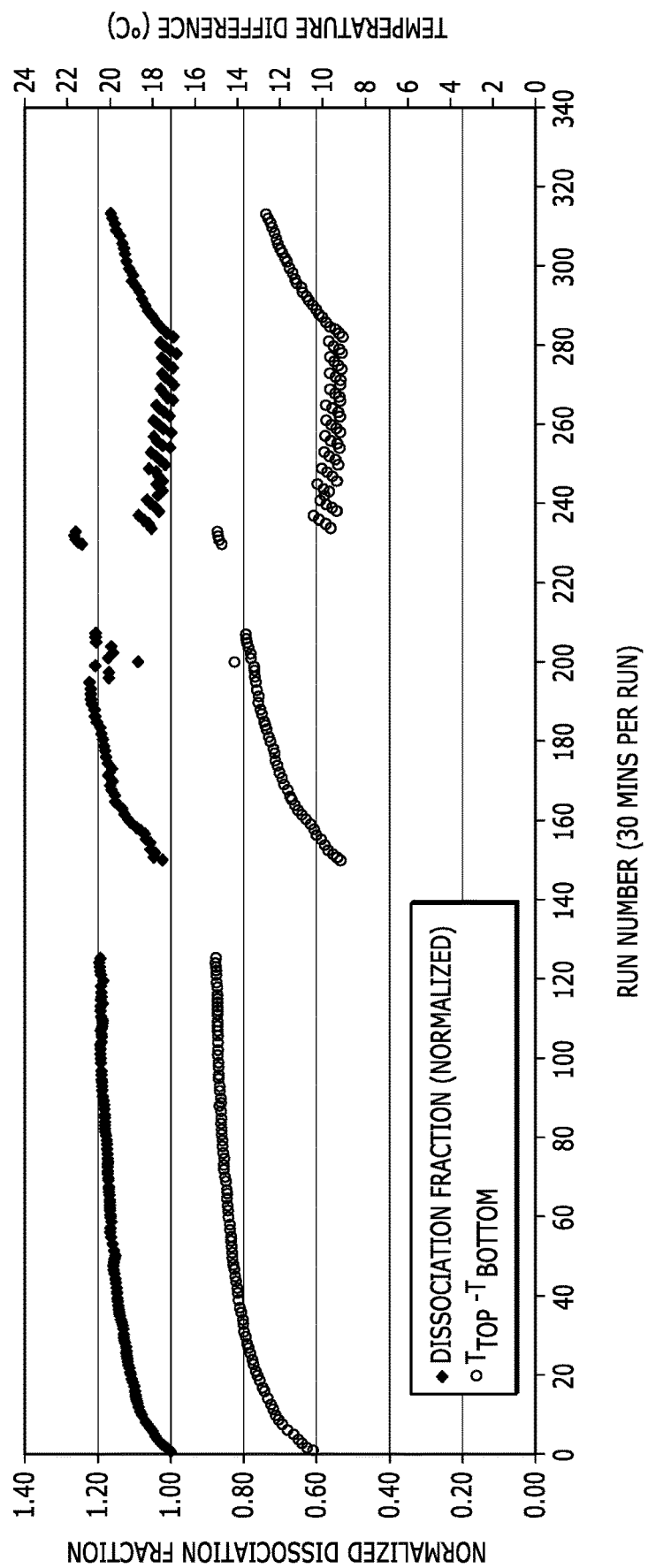
FIG. 11 shows a graph detailing the correlation between the disassociation fraction measured using a calorimeter system positioned downstream of the embodiment of the plasma source disclosed herein as compared to the temperature measurement technique disclosed in the present application.

FIG. 11 shows graphically the correlation between the disassociation fraction (normalized) measured using a calorimeter downstream of the plasma source 10 as compared to the $T_1$ and $T_2$ measurement technique described herein. More specifically, the disassociation fraction shown in FIG. 11 is calculated based on calorimeter power measurement and shows the reactive output from the plasma source 10 (see FIG. 1). As shown, the radical output from the plasma source 10 can be accurately determined by using the $T_1$ and $T_2$ measurement technique described herein.

The embodiments disclosed herein are illustrative of the principles of the invention. Other modifications may be employed which are within the scope of the invention. Accordingly, the devices disclosed in the present application are not limited to that precisely as shown and described herein.

What is claimed:

1. A plasma source for a processing system, comprising:
at least one gas source configured to provide at least one gas;
a plasma source body defining at least one gas inlet in fluid communication with the at least one gas source and at least one gas outlet, the plasma source having at least one passage having at least one passage surface formed within the plasma source body, the at least one passage in fluid communication with the at least one gas inlet and the at least one gas outlet and configured to have at least one plasma region formed therein;
at least one power source surrounding at least a portion of the plasma source body and configured to generate the at least one plasma region within the plasma source body, the at least one plasma region configured to disassociate the at least one gas flowing within the passage forming at least one disassociated gas;
a first thermal sensor receiver formed within the plasma source body proximate to the at least one passage surface of the at least one passage;
a first thermal sensor positioned within the first thermal sensor receiver, the first thermal sensor configured to measure a first temperature of at least one passage surface of the at least one passage at a first location;
a second thermal sensor receiver formed within the plasma source body proximate to the at least one passage surface of the at least one passage, the second thermal sensor receiver formed within the plasma source body proximate to the at least one gas outlet; and
a second thermal sensor positioned within the second thermal sensor receiver, the second thermal sensor configured to measure a second temperature of the at least one passage surface of the at least one passage at a second location.

2. The plasma source of claim 1 further comprising at least one at least one thermal regulating device coupled to the plasma source body.

3. The plasma source of claim 2 further comprising a first thermal regulating device and at least a second thermal regulating device coupled to the plasma source body.

4. The plasma source of claim 1 wherein the at least one first thermal sensor receiver formed within the plasma source body proximate to the at least one plasma region formed within the plasma source body, wherein the at least one first sensor is configured to measure a first temperature of at least one disassociated gas within the at least one plasma region.

5. The plasma source of claim 1 wherein the at least one second thermal sensor receiver formed within the plasma source body distally to the at least one plasma region formed within the plasma source body, wherein the at least one second sensor is configured to measure a second temperature of at least one re-disassociated gas not within the at least one plasma region.

6. The plasma source of claim 1 further comprising:
at least one thermal sensor receiver formed within the plasma source body proximate to the at least one passage surface of the at least one passage, the at least one thermal sensor receiver formed within the plasma source body proximate to the at least one gas outlet; and
at least one thermal sensor positioned within the at least one thermal sensor receiver, the at least one thermal sensor configured to measure a temperature of the at least one passage surface of the at least one passage at a location within the plasma source body.

7. The plasma source of claim 1 further comprising at least one processing control system in communication with at least one of the at least one gas source, at least one processing system, at least one first sensor, at least one second sensor, and at least one optional sensor.

8. The plasma source of claim 1 wherein the plasma source comprising a remote plasma source.

9. A plasma source for a processing system, comprising:
at least one gas source configured to provide at least one gas;
a plasma source body defining at least one gas inlet in fluid communication with the at least one gas source and at least one gas outlet, the plasma source having at least one passage having at least one passage surface formed within the plasma source body, the at least one passage in fluid communication with the at least one gas inlet and the at least one gas outlet;
at least one power source surrounding at least a portion of the plasma source body, the at least one power source in communication with at least one power supply, the at least one power source configured to generate at least one plasma region within the plasma source body, the at least one plasma region configured to disassociate the at least one gas flowing within the passage forming at least one disassociated gas, the at least one disassociated gas evacuated from plasma source body via the at least one outlet;

a first thermal sensor receiver formed within the plasma source body proximate to the at least one passage surface of the at least one passage;
  a first thermal sensor positioned within the first thermal sensor receiver, the first thermal sensor configured to measure a first temperature of at least one passage surface of the at least one passage at a first location;
  a second thermal sensor receiver formed within the plasma source body proximate to the at least one passage surface of the at least one passage, the second thermal sensor receiver formed within the plasma source body proximate to the at least one gas outlet;
  a second thermal sensor positioned within the second thermal sensor receiver, the second thermal sensor configured to measure a second temperature of the at least one passage surface of the at least one passage at a second location; and
  at least one thermal regulating device coupled to the plasma source body.

10. The plasma source of claim 9 further comprising at least one at least one thermal regulating device coupled to the plasma source body.

11. The plasma source of claim 10 further comprising a first thermal regulating device and at least a second thermal regulating device coupled to the plasma source body.

12. The plasma source of claim 9 wherein the at least one first thermal sensor receiver formed within the plasma source body proximate to the at least one plasma region formed within the plasma source body, wherein the at least one first sensor is configured to measure a first temperature of at least one disassociated gas within the at least one plasma region.

13. The plasma source of claim 9 wherein the at least one second thermal sensor receiver formed within the plasma source body distally to the at least one plasma region formed within the plasma source body, wherein the at least one second sensor is configured to measure a second temperature of at least one re-disassociated gas not within the at least one plasma region.

14. The plasma source of claim 9 further comprising:
  at least one thermal sensor receiver formed within the plasma source body proximate to the at least one passage surface of the at least one passage, the at least one thermal sensor receiver formed within the plasma source body proximate to the at least one gas outlet; and
  at least one thermal sensor positioned within the at least one thermal sensor receiver, the at least one thermal sensor configured to measure a temperature of the at least one passage surface of the at least one passage at a location within the plasma source body.

15. The plasma source of claim 9 further comprising at least one processing control system in communication with at least one of the at least one gas source, at least one processing system, at least one first sensor, at least one second sensor, and at least one optional sensor.

16. The plasma source of claim 9 wherein the plasma source comprising a remote plasma source.

17. A method of monitoring the radical output from a plasma source, comprising:
  providing a plasma source body defining at least one gas inlet in fluid communication with at least one gas source and at least one gas outlet, the plasma source having at least one passage defined by at least one passage surface formed within the plasma source body, the at least one passage in fluid communication with the at least one gas inlet and the at least one gas outlet;
  flowing at least one input gas from the at least one gas source into the at least one passage via the at least one inlet;
  forming at least one plasma region within the plasma source body with at least one power source;
  disassociating at least a portion of the at least one input gas flowing thought the at least one passage to form at least one disassociated gas;
  measuring a first temperature resulting from recombination of the at least one disassociated gas with at least a first sensor positioned proximate to the at least one plasma region; and
  measuring at least a second temperature of at least one re-disassociated gas with at least a second sensor positioned distally from the at least one plasma region; and
  monitoring the radical output of the plasma source by comparing the first temperature of the recombination of the disassociated gas measure by the at least one first sensor to the second temperature of the at least one re-disassociated gas measured with the at least one second sensor.

18. The method of claim 17 further comprising regulating a temperature of at least one or the plasma source body, the at least one plasma region, and the input gas with at least one thermal regulating body.

19. The method of claim 17 further comprising measuring at least a third temperature of at least one of the at least one input gas, at least one disassociated gas, and at least one re-disassociated gas within the plasma source body with at least one sensor.

20. The method of claim 19 further comprising selectively varying the generation of a radial output from a plasma source by selectively controlling at least one of the at least one gas source and at least one power source configured to form the at least one plasma region based on data received from at least one of the at least one first sensor, at least one second sensor, and at least one optional sensor.

* * * * *